(12) United States Patent
Lee et al.

(10) Patent No.: US 7,948,272 B2
(45) Date of Patent: May 24, 2011

(54) INPUT BUFFER FOR DETECTING AN INPUT SIGNAL

(75) Inventors: Dong-jin Lee, Seoul (KR); Jung-bae Lee, Gyeonggi-do (KR); Kyu-hyoun Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1077 days.

(21) Appl. No.: 10/990,412

(22) Filed: Nov. 18, 2004

(65) Prior Publication Data
US 2005/0116746 A1 Jun. 2, 2005

(30) Foreign Application Priority Data

Nov. 27, 2003 (KR) .................. 10-2003-0084959
Apr. 20, 2004 (KR) .................. 10-2004-0027157

(51) Int. Cl.
*H03K 5/22* (2006.01)
(52) U.S. Cl. ............... 327/77; 327/80; 327/81; 327/108
(58) Field of Classification Search .................... 327/77, 327/78, 80, 81, 85, 108
See application file for complete search history.

(56) References Cited

U.S. PATENT DOCUMENTS

| 4,705,961 | A | * | 11/1987 | Ainsworth et al. | 327/135 |
| 4,912,420 | A | * | 3/1990 | Parnell | 327/78 |
| 4,947,309 | A | * | 8/1990 | Jonsson | 363/17 |
| 5,091,842 | A | * | 2/1992 | Kawai | 363/98 |
| 5,894,423 | A | * | 4/1999 | Ling et al. | 700/293 |
| 6,091,234 | A | * | 7/2000 | Kitagawa | 323/244 |
| 6,194,913 | B1 | * | 2/2001 | Verkinderen et al. | 326/83 |
| 6,246,222 | B1 | * | 6/2001 | Nilles et al. | 323/283 |
| 6,269,011 | B1 | * | 7/2001 | Ohshima | 363/50 |
| 6,323,687 | B1 | * | 11/2001 | Yano | 326/83 |
| 2007/0182461 | A1 | * | 8/2007 | Harvey | 327/112 |

FOREIGN PATENT DOCUMENTS

JP          06-215573          8/1994

(Continued)

OTHER PUBLICATIONS

Office Action dated Nov. 14, 2008 from The Paten toffice of the People's Republic of China.

*Primary Examiner* — Long Nguyen
(74) *Attorney, Agent, or Firm* — Volentine & Whitt, PLLC (57) ABSTRACT

An input buffer which detects an input signal. The input buffer including an output node, a first buffer, and a second buffer. The first buffer may control the voltage level of the output node when the voltage level of a reference voltage signal is equal to a predetermined voltage level. The second buffer may control the voltage level of the output node in response to the input signal when the voltage level of the reference voltage signal is lower than the predetermined voltage level. The second buffer may maintain the output node at a first level. The second buffer may include an output control section and a level control unit. The output control section may receive the input signal and generate a level output signal at a second level. The level control section may generate a control signal which maintains the output node at the first level, in response to the level output signal when the voltage level of the reference voltage signal is lower than the predetermined voltage level of the first voltage and may intercept the control signal when the voltage level of the reference voltage signal is equal to the predetermined voltage level.

34 Claims, 7 Drawing Sheets

FOREIGN PATENT DOCUMENTS

| | | |
|---|---|---|
| JP | 08-203281 | 8/1996 |
| JP | 2002-246891 | 8/2002 |
| JP | 2002-358781 | 12/2002 |
| KR | 1020020029701 A | 4/2002 |
| KR | 2003-0085842 | 11/2003 |
| KR | 2003-0094629 | 12/2003 |

* cited by examiner

INPUT BUFFER FOR DETECTING AN INPUT SIGNAL

BACKGROUND OF THE INVENTION

1. Field of the Invention

Embodiments of the present invention relate to an input buffer of a semiconductor device which detects the voltage level of an input signal during a power-up operation. Priority is claimed of Korean Patent Application No. 2003-84859, filed on Nov. 27, 2003, in the Korean Intellectual Property Office, the disclosure of which is incorporated herein in its entirety by reference.

2. Description of the Related Art

The power-up sequence of semiconductor devices having dynamic random access memories (DRAMs) includes detecting input signals and driving output pins of the semiconductor devices to a high resistance (Hi-Z) state, before reference voltage signals are applied to the semiconductor devices. The input signals are voltages which control an operational mode of the semiconductor devices in a power-down mode or an active mode, after the semiconductor devices are turned on (powered up). However, in some semiconductor devices, while the reference voltage signals are applied to the semiconductor device after it is powered up, the semiconductor devices may not properly detect the input signals, resulting in erroneous operation of the semiconductor device.

Figure 1:
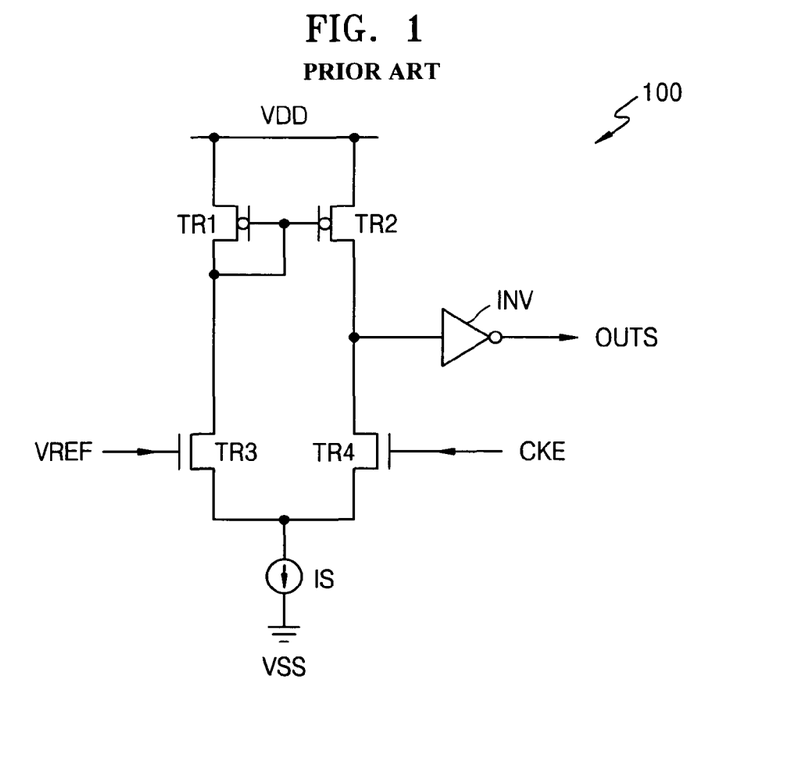
FIG. 1 is a circuit diagram illustrating an input buffer of a semiconductor device.

FIG. 1 is circuit diagram illustrating an input buffer of a semiconductor device. The input buffer 100 comprises first and second transistors TR1 and TR2 (forming a current mirror), third and fourth transistors TR3 and TR4 (that receive a reference voltage signal VREF and an input signal CKE), a current source IS (that drives the input buffer 100), and an inverter INV (that outputs an output signal OUTS).

After the semiconductor device is powered up, the input buffer 100 receives the input signal CKE, and should output the output signal OUTS at a low level. Then, in response to the output signal OUTS of the input buffer 100, an output pin (not shown) can be maintained in a high resistance (Hi-Z) state. The voltage level of the input signal CKE is generally lower than the voltage level of the reference voltage signal VREF. Therefore, the input buffer 100 shown in FIG. 1 can output the output signal OUTS at a low level. Then, the output pin (not shown) can be driven to a high resistance (Hi-Z) state. However, before the voltage level of the reference voltage signal VREF reaches a predetermined voltage level after the semiconductor device is powered up, the input buffer 100 may not detect the voltage level of the input signal CKE at a low level.

For example, if the voltage level of the reference voltage signal VREF is 0V right after the semiconductor device is powered up and the voltage level of the input signal CKE is greater than the voltage level of the reference voltage signal VREF, then the input buffer 100 outputs the output signal OUTS at a high level. As a result, the output pin (not shown) may not be able to be driven to a high resistance (Hi-Z) state and the semiconductor device may operate erroneously.

SUMMARY OF THE INVENTION

Embodiments of the present invention relate to an input buffer which detects an input signal during the power-up operation of a semiconductor device. Embodiments relate to a semiconductor device which detects an input signal during the power-up operation of the semiconductor device. An input buffer may include an output node, a first buffer, and a second buffer. The first buffer controls the voltage level of the output node when the voltage level of a reference voltage signal is equal to a first voltage level. The second buffer controls the voltage level of the output node in response to an input signal when the voltage level of the reference voltage signal is lower than the first voltage level.

The second buffer drives the voltage level of the output node at a first level. The first buffer may be a differential amplifier that is connected between a source voltage and a ground voltage and controls the voltage level of the output node in accordance with a comparison of the input signal and the reference voltage signal.

The second buffer may include an output control section and a level control section. The output control section receives the input signal and generates a level output signal at a second level. The level control section generates a control signal for driving the output node at a first level in response to the level output signal, when the voltage level of the reference voltage signal is lower than the first voltage level. The level control section over rides the control signal when the voltage level of the reference voltage signal is equal to the voltage level of the first voltage.

The output control section may include a first variable resistor, a first transistor, a second transistor, a second variable resistor, and an inverter. One end of the first variable resistor is connected to a source voltage. The first terminal of the first transistor is connected to the other end of the first variable resistor. The gate of the first transistor is supplied with the input signal. The second terminal of the first transistor is connected to a second node. The first terminal of the second transistor is connected to the second node. The gate of the second transistor is supplied with the input signal. One end of the second variable resistor is connected to the second terminal of the second transistor and the other end of the second variable resistor is connected to a ground voltage.

The inverter may invert the voltage level of the second node and output the inverted voltage level as the level output signal. The sizes of the first variable resistor, the second variable resistor, the first transistor, and the second transistor of the output control section may be adjusted such that the level output signal is output at a second level.

The level control section may include a third transistor and a fourth transistor. The first terminal of the third transistor is connected to a source voltage and the gate of the third transistor is supplied with the level output signal. The first terminal of the fourth transistor is connected to the second terminal of the third transistor. The gate of the fourth transistor is supplied with the reference voltage signal. The second terminal of the fourth transistor is connected to the output node.

The control signal may be applied to the output node through the second terminal of the fourth transistor. The fourth transistor may be turned on when the voltage level of the reference voltage signal is lower than the first voltage level. The fourth transistor may be turned off when the voltage level of the reference signal is greater than the voltage level of the first voltage. In embodiments, the voltage level of the first voltage may be half of the source voltage level.

According to embodiments of the present invention, an input buffer includes an output node, a first buffer, a second buffer, and a buffer control unit. The first buffer is turned off in response to a buffer control signal, when the voltage level of a reference voltage signal is lower than the first voltage level. The first buffer controls the voltage level of the output node when the voltage level of the reference voltage signal is equal to the voltage level of the first voltage. The second buffer controls the voltage level of the output node in response to an input signal, when the voltage level of the reference voltage signal is lower than the first voltage level. The buffer control unit outputs a buffer control signal for turning on or turning off the first buffer, in accordance with the voltage level of the reference voltage signal.

According to embodiments of the present invention, a semiconductor device includes an input buffer, a latency control unit, an output selecting unit, and an output driver. The input buffer receives an input signal and outputs a level detecting signal with a predetermined level, until the voltage level of a reference voltage signal reaches the first voltage level. The latency control unit activates or deactivates a data control signal for controlling transmission and interception of data, in response to the level detecting signal.

The output selecting unit transmits or blocks the data in response to the data control signal, and generates an up-gate signal and a down-gate signal for driving an output pin at a high impedance level, in response to the level detecting signal. The output driver outputs the data through the output pin in response to the up-gate signal and the down-gate signal. The input buffer may generate the level detecting signal at a second level, until the voltage level of the reference voltage signal reaches the first voltage level. When the level detecting signal is at a second level, the data control signal may be deactivated. When the data control signal is deactivated, the output selecting unit may intercept the data.

The output driver may include a first output transistor and a second output transistor. The first terminal of the first output transistor is connected to an output source voltage. The gate of the first output transistor is supplied with the up-gate signal. The second terminal of the first output transistor is connected to the output pin. The first terminal of the second output transistor is connected to the output pin. The gate of the second output transistor is supplied with the down-gate signal. The second terminal of the second output transistor is connected to an output ground voltage. When the level detecting signal is at a second level, the first output transistor and the second output transistor may both be turned off.

The input buffer may include an output node, a first buffer, and a second buffer. The first buffer controls the voltage level of the output node when the voltage level of the reference voltage signal is equal to the voltage level of the first voltage. The second buffer controls the voltage level of the output node in response to an input signal when the voltage level of the reference voltage signal is lower than the voltage level of the first voltage. The voltage level of the output node is opposite to the voltage level of the level detecting signal.

BRIEF DESCRIPTION OF THE DRAWINGS

Aspects and features of the present invention will become readily apparent from the detailed description that follows, with reference to the accompanying drawings, in which.

DETAILED DESCRIPTION OF THE INVENTION

The attached drawings illustrate example embodiments of the present invention and are referred to in order to gain a sufficient understanding of the present invention, the merits thereof, and the objectives accomplished by the implementation of the present invention. Hereinafter, the present invention will be described in detail by explaining example embodiments of the invention with reference to the attached drawings.

Figure 2:
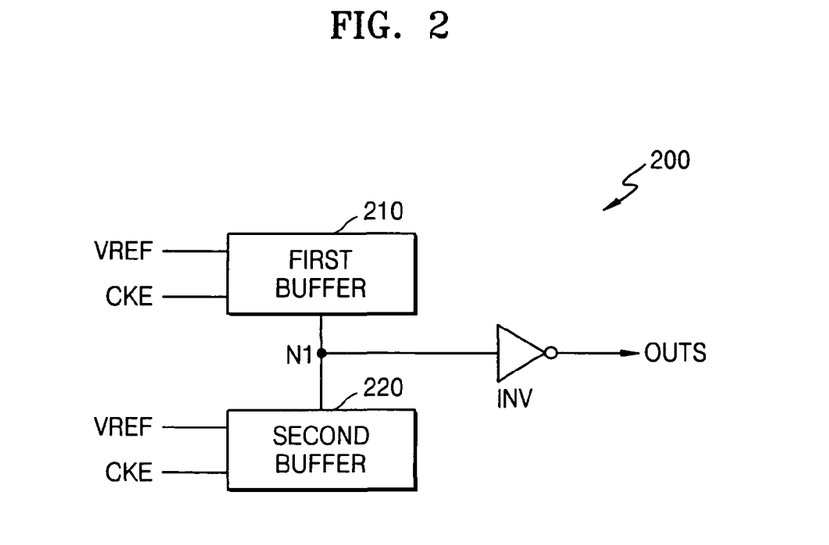
FIG. 2 is a block diagram illustrating an input buffer, according to embodiments of the present invention.
Figure 3:
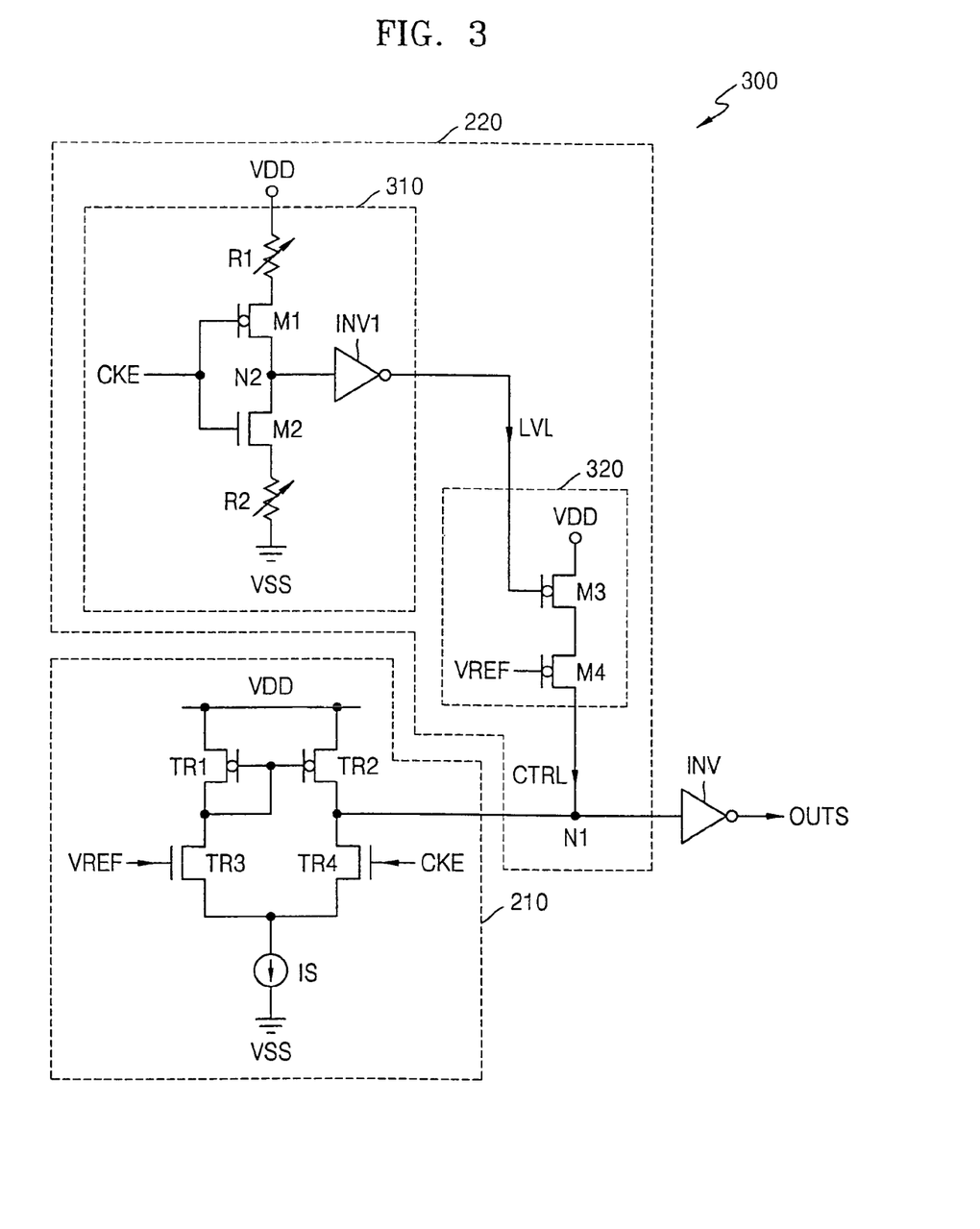
FIG. 3 is a circuit diagram illustrating an input buffer.

FIG. 2 is a block diagram illustrating an input buffer, according to embodiments of the present invention. FIG. 3 is a circuit diagram illustrating the input buffer shown in FIG. 2. The input buffer 200, according to embodiments of the present invention, comprises a first buffer 210 and a second buffer 220, which receive a reference voltage signal VREF, receive an input signal CKE, and control the voltage level of an output node N1. The voltage level of the output node N1 is inverted by an inverter INV and then output as a level detecting signal OUTS.

In FIG. 3, the input buffer 300 includes the output node N1, the first buffer 210, and the second buffer 220. The first buffer 210 controls the voltage level of the output node N1, when the voltage level of the reference voltage signal VREF is equal to a first voltage level. The first buffer 210 is a differential amplifier, which is connected between a source voltage VDD and a ground voltage VSS. The first buffer 210 controls the voltage level of the output node N1, based on a comparison of the input signal CKE and the reference voltage signal VREF.

The second buffer 220 controls the voltage level of the output node in response to the input signal CKE, when the voltage level of the reference voltage signal VREF is lower than the first voltage level. The second buffer 220 controls the output node N1 at a first level.

The input buffer 300, according to embodiments of the present invention, senses the voltage level of the input signal CKE and outputs the level detecting signal OUTS at a low level, until the voltage level of the reference voltage signal VREF reaches a predetermined voltage level after a semiconductor device (not shown) is powered up.

The first buffer 210 has a similar configuration as the input buffer 100 shown in FIG. 1. Accordingly, the first buffer 210 senses the input signal CKE at a high level, until the voltage level of the reference voltage signal VREF reaches the predetermined voltage level. Then, the output node N1 turns to a low level, and the level detecting signal OUTS with a high level is output.

In embodiments, the predetermined voltage level is the first voltage level and the first voltage level is a half of the source voltage level. The source voltage may be a source voltage used in an output driver of the semiconductor device (not shown).

The voltage level of the output node N1 may be driven to a high level by the second buffer 220. In other words, the second buffer 220 maintains the output node N1 at a high level, until the voltage level of the reference voltage signal VREF reaches the predetermined voltage level, after the semiconductor device (including the input buffer 300) is powered up. The level detecting signal OUTS at a low level can then be output through the inverter INV. The second buffer 220 may include an output control section 310 and a level control section 320 to output the level detecting signal OUTS at a low level.

The output control section 310 receives the input signal CKE. Based on the set resistances of inner resistors R1, R2 and transistors M1, M2, the output control section 310 generates a level output signal LVL at a second level. The output control section 310 includes a first variable resistor R1, a first transistor M1, a second transistor M2, a second variable resistor R2 and an inverter INV1. One end of the first variable resistor R1 is connected to the source voltage VDD. The first terminal of the first transistor M1 is connected to the other end of the first variable resistor R1, the input signal CKE is applied to the gate of the first transistor M1, and the second terminal of the first transistor M1 is connected to a second node N2.

The first terminal of the second transistor M2 is connected to the second node N2, and the input signal CKE is applied to the gate of the second transistor M2. One end of the second variable resistor R2 is connected to the second terminal of the second transistor M2, and the other end of the second variable resistor R2 is connected to the ground voltage VSS. The inverter INV1 inverts the voltage level of the second node N2, and thus generates the level output signal LVL.

The level control section 320 generates a control signal CTRL, which controls the output node N1 to maintain the first voltage level, in response to the level output signal LVL, when the voltage level of the reference voltage signal VREF is lower than the voltage level of the first voltage. The level control section 320 does not contribute to the control signal CTRL, when the voltage level of the reference voltage level VREF is equal to the voltage level of the first voltage. The level control section 320 includes a third transistor M3 and a fourth transistor M4. The first terminal of the third transistor M3 is connected to the source voltage VDD, and the level output signal LVL is applied to the gate of the third transistor M3. The first terminal of the fourth transistor M4 is connected to the second terminal of the third transistor M3. The reference voltage signal VREF is applied to the gate of the fourth transistor M4. The second terminal of the fourth transistor M4 is connected to the output node N1. The control signal CTRL is applied to the output node N1 through the second terminal of the fourth transistor M4.

The output control section 310 generate the level output signal LVL based on the resistances of the first variable resistor R1, the second variable resistor R2, the first transistor M1 and the second transistor M2, in response to the input signal CKE, so that the level output signal LVL is output at a second voltage level. The length and the width of the first transistor M1 and the second transistor M2 are designed so that the first transistor M1 is turned on and the second transistor M2 is turned off, in response to the input signal CKE. When the voltage level of the input signal CKE is varied, a designer of the input buffer 300 can adjust the sizes of the first variable resistor R1, the second variable resistor R2, the first transistor M1 and the second transistor M2.

The fourth transistor M4 is turned on when the voltage level of the reference voltage signal VREF is lower than the first voltage level. The fourth transistor M4 is turned off when the voltage level of the reference voltage signal VREF is greater than the voltage level. In other words, until the voltage level of the reference voltage signal VREF reaches the voltage level of the first voltage, the fourth transistor M4 is turned on. Since the third transistor M3 is turned on by means of the level output signal LVL, the fourth transistor M4 outputs the control signal CTRL at a first level (i.e. a high level). Therefore, the voltage level of the output node N1 is maintained at a high level.

Since the tendency that the control signal CTRL maintains the voltage level of the output node N1 at a high level is greater than the tendency that the output of the first buffer 210 maintains the voltage level of the output node N1 at a low level, the voltage level of the output node N1 may be maintained at a high level. Since the voltage level of the output node N1 is maintained at a high level, the level detecting signal OUTS at a low level is output. In other words, the voltage level of the level detecting signal OUTS is output at a low level, until the voltage level of the reference voltage signal VREF reaches the voltage level of the first voltage, after the semiconductor device is powered up. Therefore, an output pin of the output driver (not shown) can driven to a high resistance (Hi-Z) state by the level detecting signal OUTS.

If the voltage level of the reference voltage signal VREF is equal to the voltage level of the first voltage, the fourth transistor M4 is turned off, so that the second buffer 220 cannot control the voltage level of the output node N1. At this time, the first buffer 210 detects the voltage level of the input signal CKE.

Figure 4:
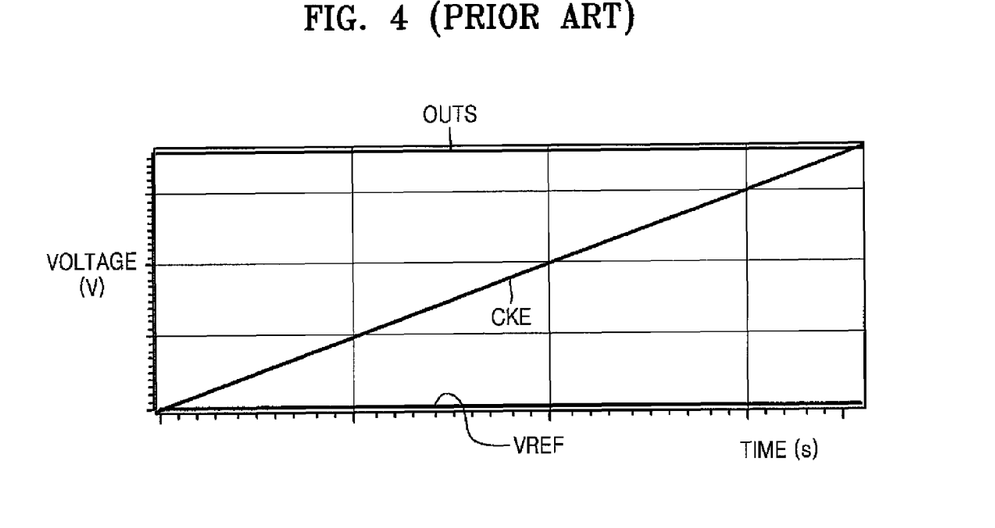
FIG. 4 is a diagram illustrating results of a simulation of the input buffer of in FIG. 1.
Figure 5:
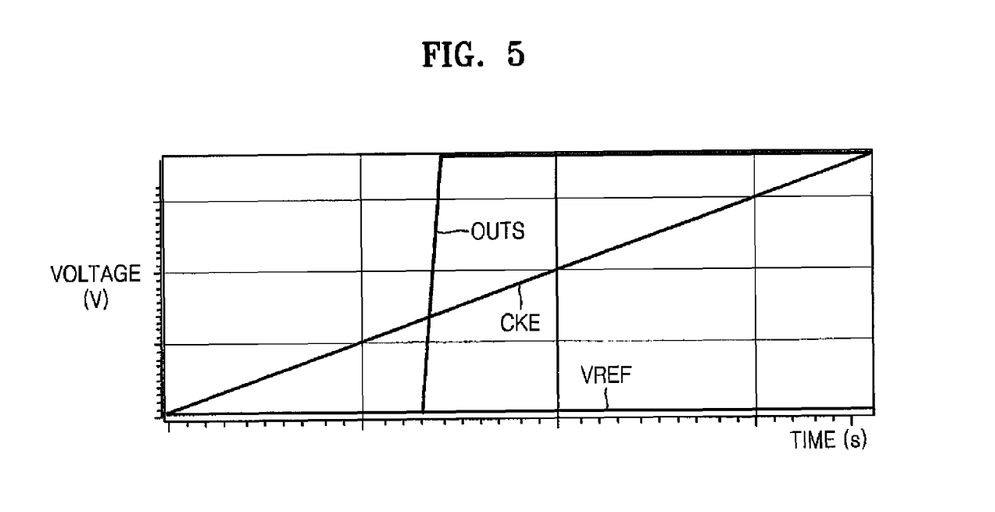
FIG. 5 is a diagram illustrating results of a simulation of an input buffer, according to embodiments of the present invention.

FIG. 4 is a diagram illustrating a result of simulating the conventional input buffer shown in FIG. 1. FIG. 5 is a diagram illustrating a result of simulating the input buffer, according to embodiments of the present invention shown in FIG. 3. FIGS. 4 and 5 shows waveforms of the level detecting signals OUTS as outputs of the input buffers 100 and 300, when the voltage level of the input signal CKE is varied from 0V to the source voltage (VDD) level in a state where the voltage level of the reference voltage signal VREF is maintained at a low level.

In FIG. 4, since the input buffer 100 does not detect the state where the voltage level of the input signal CKE is at a low level, the level detecting signal OUTS with a high level is always output. In FIG. 5, since the input buffer 300, according to embodiments of the present invention, can detect the state where the voltage level of the input signal CKE is at a low state, the level detecting signal OUTS is maintained at a low level. When the power-up sequence is finished, the level detecting signal OUTS at a high level is output.

Figure 6:
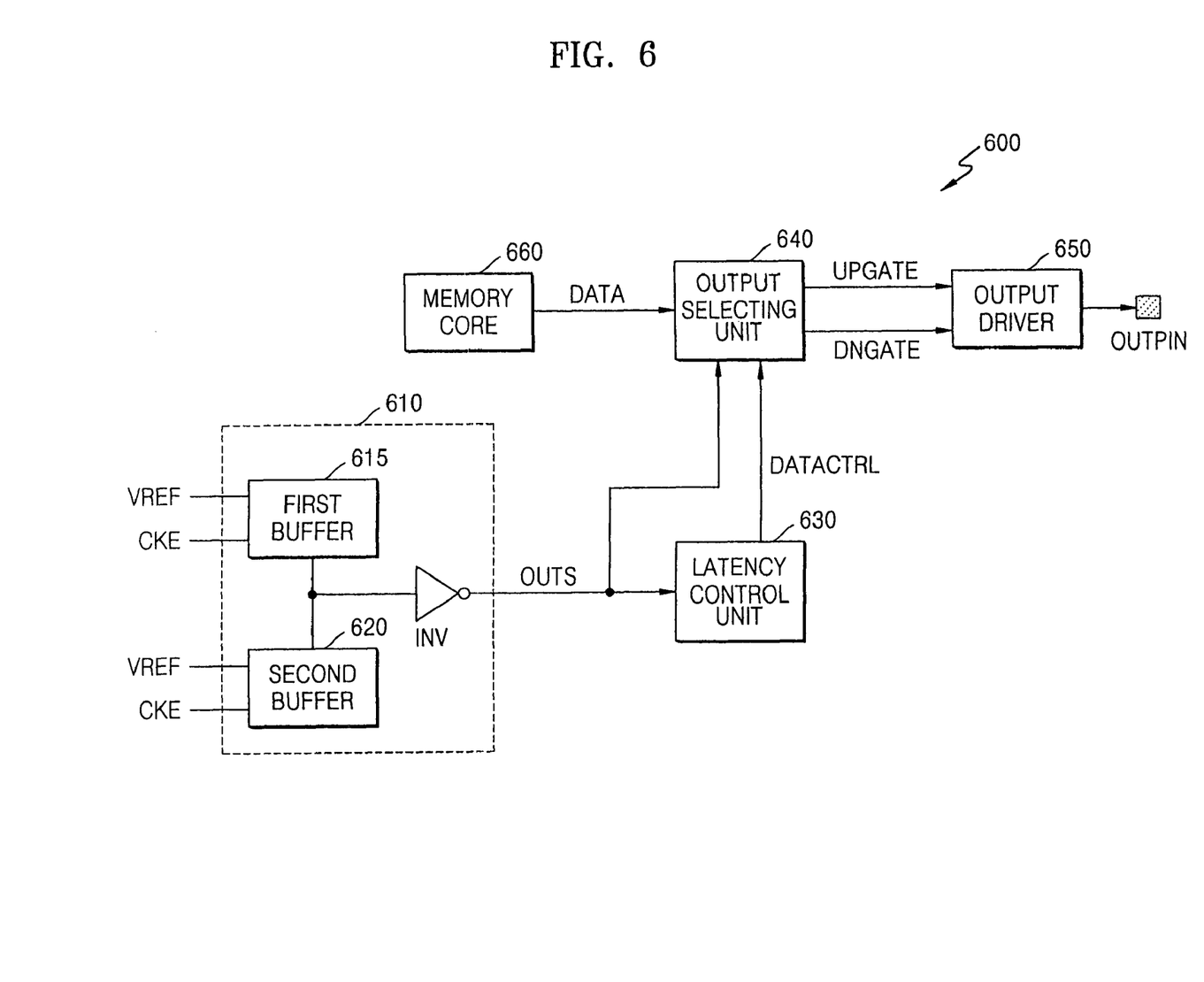
FIG. 6 is a block diagram illustrating a semiconductor device, according to embodiments of the present invention.
Figure 7:
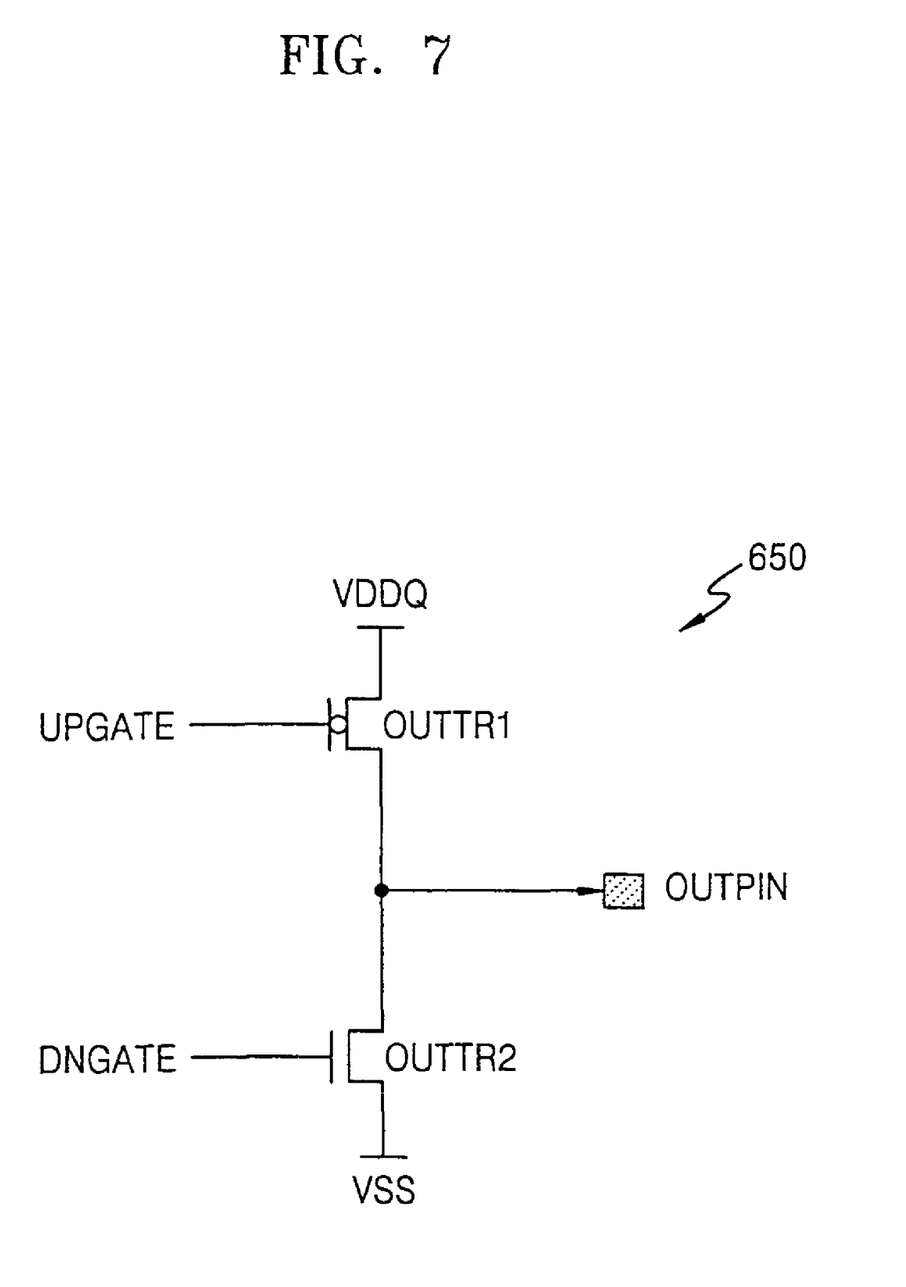
FIG. 7 is a diagram illustrating an output driver.

FIG. 6 is a block diagram illustrating a semiconductor device, according embodiments of the present invention. FIG. 7 is a diagram illustrating the output driver shown in FIG. 6. A semiconductor device 600, according to embodiments of the present invention, comprises an input buffer 610, a latency control unit 630, an output selecting unit 640, and an output driver 650. The input buffer 610 receives an input signal CKE and outputs a level detecting signal OUTS at a predetermined level, until the voltage level of a reference voltage signal VREF reaches the voltage level of a first voltage. The latency control unit 630 activates or deactivates a data control signal DATACTRL for controlling transmission and interception of data DATA, in response to the level detecting signal OUTS.

The output selecting unit 640 transmits or intercepts the data DATA in response to the data control signal DATACTRL. The output selecting unit 640 generates an up-gate signal UPGATE and a down-gate signal DNGATE, controlling an output pin OUTPIN at a high resistance state, in response to the level detecting signal OUTS. The output driver 650 outputs the data DATA through the output pin OUTPIN in response to the up-gate signal UPGATE and the down-gate signal DNGATE. The input buffer 610 generates the level detecting signal OUTS at a second level, until the voltage level of the reference voltage signal VREF reaches the first voltage level. Structures of a first buffer 615 and a second buffer 620 of the input buffer 610 are similar to the input buffer 300 shown in FIG. 3.

When the data control signal DATACTRL is activated, the output selecting unit 640 receives the data DATA from a memory core 660, and outputs the data DATA through the output driver 650. When the data control signal DATACTRL is deactivated, the output selecting unit 640 intercepts the data DATA from the memory core 660.

When the level detecting signal OUTS output from the input buffer 610 is at a second level (i.e. a low level), the latency control unit 630 deactivates the data control signal DATACTRL. The output selecting unit 640 then intercepts the data DATA. The output selecting unit 640 generates the up-gate signal UPGATE and the down-gate signal DNGATE, controlling the output pin OUTPIN into a high resistance state, in response to the level detecting signal OUTS.

The output driver 650 includes a first output transistor OUTTR1 and a second output transistor OUTTR2. The first terminal of the output transistor OUTTR1 is connected to an output source voltage VDDQ. The up-gate signal UPGATE is applied to the gate of the first output transistor OUTTR1. The second terminal of the first output transistor OUTTR1 is connected to the output pin OUTPIN. The first terminal of the second output transistor OUTTR2 is connected to the output pin OUTPIN. The down-gate signal DNGATE is applied to the gate of the second output transistor OUTTR2. The second terminal of the second output transistor OUTTR2 is connected to an output ground voltage VSSQ. The output driver 650 turns on one of the first output transistor OUTTR1 and the second output transistor OUTTR2, in accordance with a logic level of the data DATA, and outputs the data DATA through the output pin OUTPIN.

The output selecting unit 640 outputs the up-gate signal UPGATE and the down-gate signal DNGATE with respective levels, allowing turning off both the first output transistor OUTTR1 and the second output transistor OUTTR2, in response to the level detecting signal OUTS having a low level. In other words, when the level detecting signal OUTS is at a low level, the data DATA is intercepted, and the first output transistor OUTTR1 and the second output transistor OUTTR2 are both turned off. Therefore, the output pin OUTPIN can be driven to a high resistance (Hi-Z) state. Accordingly, when the input buffer 610 detects the voltage level of the input signal CKE and outputs the level detecting signal OUTS having a low level, after the semiconductor device 600 is powered up, the latency control unit 630 and the output selecting unit 640 turn off both the first output transistor OUTTR1 and the second output transistor OUTTR2. Accordingly, the output pin OUTPIN can be driven to the high resistance (Hi-Z) state.

Figure 8:
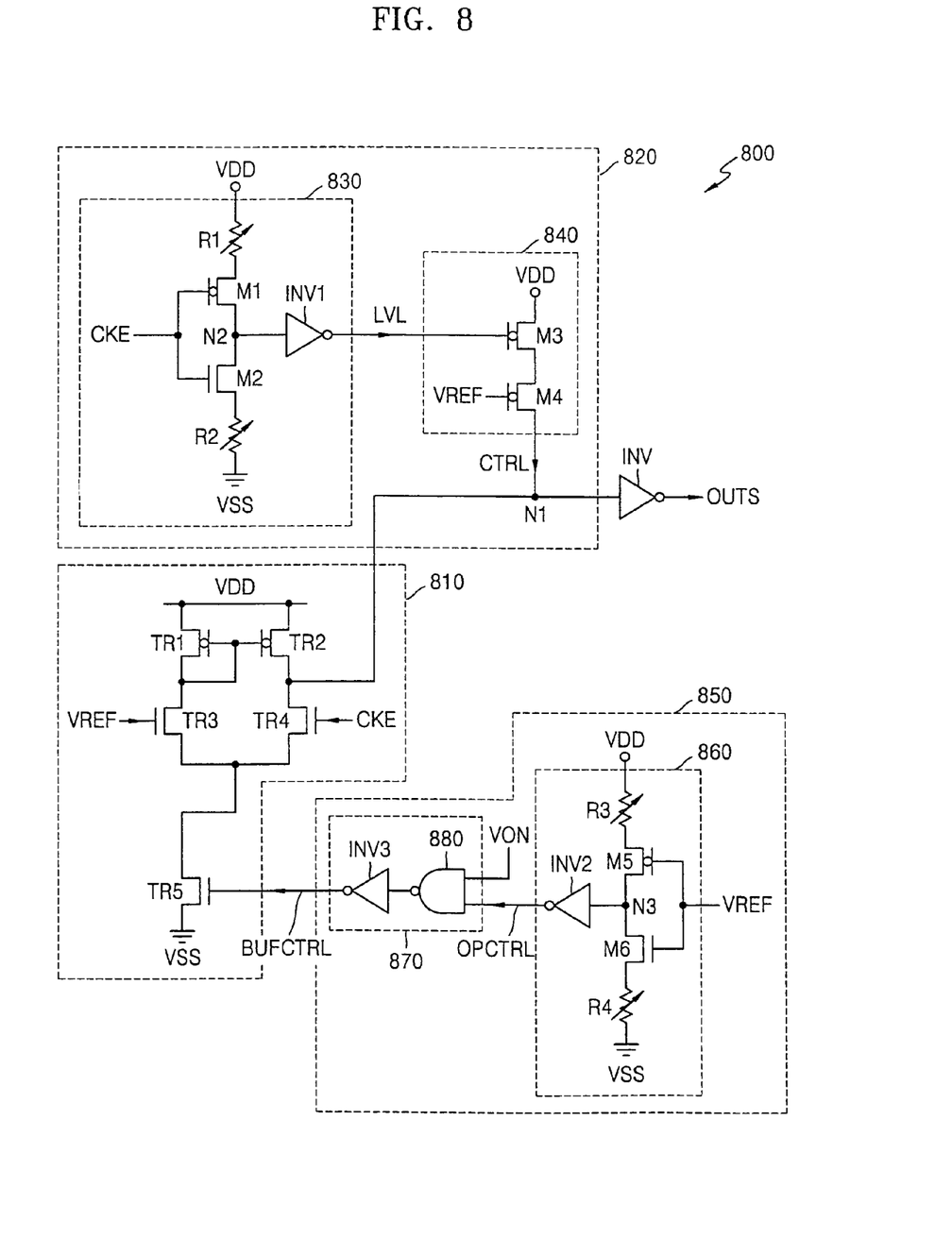
FIG. 8 is a block diagram illustrating an input buffer, according to embodiments of the present invention.

FIG. 8 is a block diagram illustrating an input buffer according to embodiments of the present invention. The input buffer 800, according to embodiments of the present invention, includes an output node N1, a first buffer 810, a second buffer 820, and a buffer control unit 850. The first buffer 810 is turned off in response to a buffer control signal BUFCTRL, when the voltage level of a reference voltage signal VREF is lower than the first voltage level and controls the voltage level of the output node N1 when the voltage level of the reference voltage signal VREF is equal to the first voltage level. Here, the voltage level of the first voltage may be half of the level of a source voltage VDD. The second buffer 820 controls the voltage level of the output node N1 in response to an input signal CKE, when the reference voltage signal VREF is lower than the first voltage level. The buffer control unit 850 outputs the buffer control signal BUFCTRL for turning on or turning off the first buffer 810, in response to the reference voltage signal.

In the input buffer 300 shown in FIG. 3, until the voltage level of the reference voltage level VREF is equal to a first voltage level after the power-up operation of the semiconductor device (not shown) on which the input buffer 300 is mounted, the first buffer operates continuously. Therefore, leakage current may be continuously generated due to the current source IS of the first buffer 210.

In the input buffer 800 shown in FIG. 8, the leakage current can be removed. The first buffer 810 of the input buffer 800 shown in FIG. 8 includes a transistor TR5. Transistor TR5 is controlled by the buffer control signal BUFCTRL, instead of the current source IS of the first buffer 210 shown in FIG. 3. The first buffer 210 shown in FIG. 3 operates during the operation of the current source IS, but the first buffer 810 shown in FIG. 8 operates only during operation of the transistor TR5.

The operations of the first and second buffers 810 and 820 during the turning-on of the transistor TR5 of the first buffer 810 in FIG. 8 are similar to the operations of the first and second buffers 210 and 220 of the input buffer 300 in FIG. 3.

The buffer control unit 850 outputs the buffer control signal BUFCTRL at a second level when the voltage level of the reference voltage signal VREF is lower than the first voltage level. The buffer control unit 850 outputs the buffer control signal BUFCTRL at a first level, when the voltage level of the reference voltage signal VREF is equal to the first voltage level.

In other words, the buffer control unit 850 turns off the first buffer 810 by outputting the buffer control signal BUFCTRL at a second level when the voltage level of the reference voltage signal VREF is lower than the first voltage level. The voltage level of the output node N1 can be controlled to a low level by the second buffer 820. The buffer control unit 850 then turns on the first buffer 810 by outputting the buffer control signal BUFCTRL at a first level, when the voltage level of the reference voltage signal VREF is equal to the first voltage level. In this circumstance, the fourth transistor M4 of the second buffer 820 are turned off and the second buffer 820 cannot control the voltage level of the output node N1. Instead, the first buffer 810 controls the voltage level of the output node N1 to a low level. Accordingly, the buffer control unit 850 turns on or turns off the first buffer 810 in response to the voltage level of the reference voltage signal VREF.

The buffer control unit 850 includes an operation control section 860 and a logical product section 870. The operation control section 860 receives the reference voltage signal VREF and generates an operation control signal OPCTRL at a second level when the voltage level of the reference voltage signal VREF is lower than the voltage level of the first voltage, by controlling the sizes of inner resistors and transistors. Then, the operation control section 860 generates the operation control signal OPCTRL at a first level when the voltage level of the reference voltage signal VREF is equal to the first voltage level.

The operation control unit 860 includes a third variable resistor R3, a fifth transistor M5, a sixth transistor M6, a fourth resistor R4, and an inverter INV2. The third variable resistor R3 is connected to the source voltage VDD at one end. The fifth transistor M5 is connected to the other end of the third variable resistor R3 at the first terminal. The gate of the fifth transistor M5 is supplied with the reference voltage signal VREF. The second terminal of the fifth transistor M5 is connected to a third node N3. The sixth transistor M6 is connected to the third node N3 at the first terminal. The gate of the sixth transistor M6 is supplied with the reference voltage signal VREF. One end of the fourth variable resistor R4 is connected to the second terminal of the sixth transistor M6 and the other end is connected to the ground voltage VSS. The inverter INV2 inverts the voltage level of the third node and generates the inverted voltage level as the operation control signal OPCTRL.

When the voltage level of the reference voltage signal VREF is lower than the voltage level of the first voltage, the fifth transistor M5 is turned on and the sixth transistor M6 is turned off. Then, the voltage level of the third node N3 becomes a first level (i.e. a high level) and the inverter INV2 generates the operation control signal OPCTRL at a low level. The sizes of the third variable resistor R3, the fourth variable resistor R4, the fifth transistor M5, and the sixth transistor M6 of the operation control unit 860 are controlled such that the operation control signal OPCTRL is output at a second level, when the voltage level of the reference voltage signal VREF is lower than the first voltage level.

The logical product section 870 performs a logical product of a mode signal VON and the operation control signal OPCTRL and outputs the buffer control signal BUFCTRL. The mode signal VON is a signal generated at a first level during the operation of the input buffer 800. The logical product section 870 may include a NAND gate 880 and an inverter INV3. The mode signal VON may be generated at a first level in the active mode, the standby mode, and the power-down mode of the semiconductor memory device. However, during the burn-in test mode of the semiconductor memory device on which the input buffer 800 is mounted, the mode signal VON may not be at the first level. In other words, the input buffer 800 may operate continuously after the power-up of the semiconductor memory device; except for the burn-in test mode. Even when the mode signal VON is at a first level, the operation control signal OPVTRL has a low level, so that the logical product section 870 generates the buffer control signal BUFCTRL at a low level. Therefore, when the voltage level of the reference voltage signal VREF is lower than the voltage level of the first voltage, the first buffer 810 is turned off by means of the buffer control signal BUFCTRL.

When the voltage level of the reference voltage signal VREF is equal to the first voltage level, the fifth transistor M5 is turned off and the sixth transistor M6 is turned on. This may be implemented by adjusting the sizes of the third and fourth variable resistors R3 and R4 and the fifth and sixth transistors M5 and M6. Accordingly, the buffer control signal BUFCTRL is generated at a first level and the first buffer 810 is turned on.

The buffer control unit 850 may include only the logical product section 870, performing a logical product of the mode signal VON and the reference voltage signal VREF, outputting the buffer control signal BUFCTRL. The buffer control unit 850 may not include, in embodiments, the operation control section 860 (shown in FIG. 8). Accordingly, the logical product section 870 may directly receive the mode signal VON and the reference voltage signal VREF.

By adjusting the sizes of transistors (not shown) constituting the logical product section 870, the logical product section 870 can be controlled to output the buffer control signal BUFCTRL at a low level. Accordingly, the buffer control unit 850 can control the first buffer 810 by using only the logical product section 870, directly receiving the reference voltage signal VREF and the mode signal VON. By turning off the first buffer 810 until the voltage level of the reference voltage signal VREF reaches the voltage level of the first voltage, the input buffer 800 shown in FIG. 8 can reduce the leakage current.

Figure 9A:
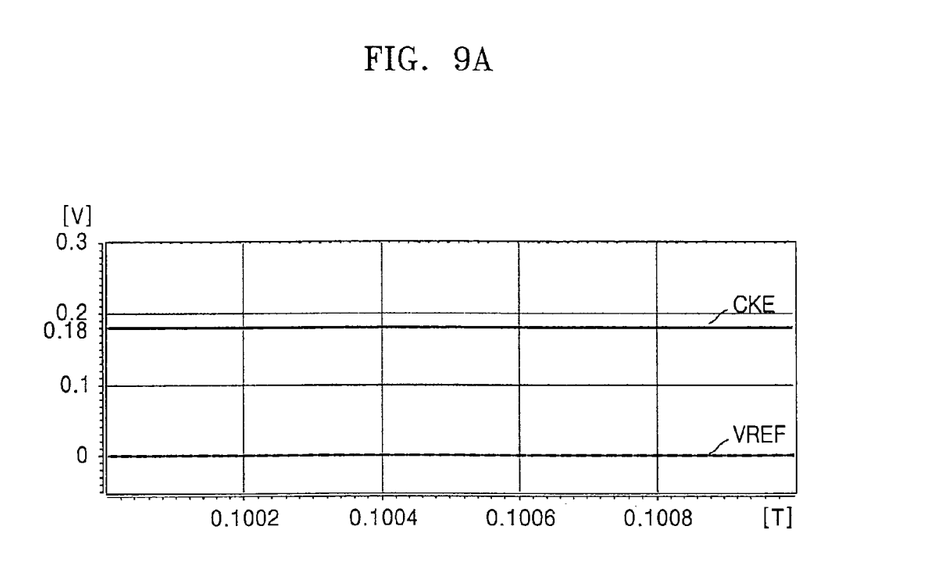
FIG. 9A is a diagram illustrating the voltage level of a reference voltage signal and an input signal, immediately after a power-up operation.
Figure 9B:
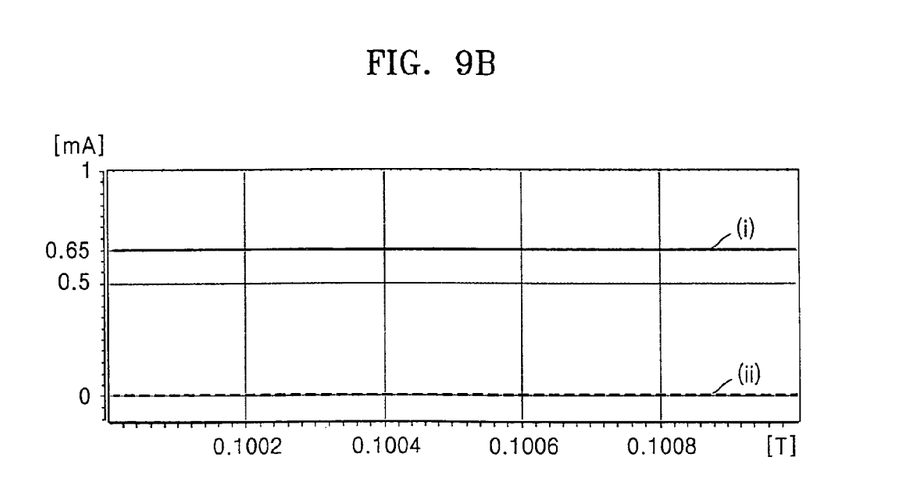
FIG. 9B is a diagram illustrating leakage current of the input buffer shown in FIG. 3 and the input buffer shown in FIG. 8.

FIG. 9A is a diagram illustrating the voltage levels of the reference voltage signal and the input signal, after power-up. FIG. 9B is a diagram illustrating the leakage current of the input buffer shown in FIG. 3 and the input buffer shown in FIG. 8.

FIG. 9A illustrates the reference voltage signal VREF (having a voltage level of 0V) and the input signal CKE (having a voltage level of 0.18V) applied to the input buffer 800. As illustrated in FIG. 9B, the leakage current I of the input buffer 300 of FIG. 3 is about 0.65 mA and the leakage current of the input buffer 800 of FIG. 8 is substantially 0 mA. That is, the input buffer 800 of FIG. 8 can remove the leakage current.

As described above, the input buffer and the semiconductor device, according to embodiments of the present invention, have the advantage of being controlled not to erroneously operate, by detecting the voltage level of the input signal and driving the output pin of the semiconductor device to a high impedance until the voltage level of the reference voltage signal reaches the predetermined voltage level, after the semiconductor device is powered up.

While the present invention has been particularly shown and described with reference to example embodiments, it will be understood by those skilled in the art that various changes in form and details may be made therein without departing from the spirit and scope of the invention as defined by the appended claims. The example embodiments should be considered in descriptive sense only and not for purposes of limitation. Therefore, the scope of the invention is defined not by the detailed description of the invention but by the appended claims, and all differences within the scope will be construed as being included in the present invention.

What is claimed is:

1. An input buffer comprising:
   an output node;
   a first buffer which receives an input signal and a reference voltage, compares the input signal and the reference voltage, and outputs a first control signal, where the first control signal controls a voltage level of an output node when the reference voltage is equal to or greater than a predetermined voltage, and does not control the voltage level of the output node when the reference voltage is less than the predetermined voltage; and
   a second buffer which receives the input signal, which controls the voltage level of the output node in response to the input signal when the reference voltage is lower than the predetermined voltage, and which does not control the voltage level of the output node when the reference voltage is equal to or greater than the predetermined voltage, wherein the second buffer comprises:
      an output control section which receives the input signal, and generates a level output signal at a second level; and
      a level control section which generates a second control signal which controls the output node at a first level in response to the level output signal when the reference voltage is lower than the predetermined voltage and overrides the second control signal when the reference voltage is equal to the predetermined voltage.

2. The input buffer according to claim 1, wherein the second buffer maintains the voltage level of the output node at a first level.

3. The input buffer according to claim 1, wherein:
   the first buffer comprises a differential amplifier connected between a source voltage and a ground voltage; and the first buffer controls the voltage level of the output node in accordance with a comparison result of the reference voltage signal and the input signal.

4. The input buffer according to claim 1, wherein the output control section comprises:
   a first resistor with one end connected to a source voltage;
   a first transistor with the first terminal connected to the other end of the first resistor, the gate is supplied with the input signal, and the second terminal is connected to a second node;
   a second transistor with the first terminal connected to the second node and the gate is supplied with the input signal;
   a second resistor with one end connected to the second terminal of the second transistor and the other end connected to a ground voltage; and
   an inverter which inverts a voltage level of the second node and outputs the inverted voltage level as the level output signal.

5. The input buffer according to claim 4, wherein the resistance of the first resistor, the second resistor, the first transistor, and the second transistor of the output control section are adjusted such that the level output signal is output at the second level.

6. The input buffer according to claim 1, wherein the level control section comprises:
   a third transistor with the first terminal connected to a source voltage and the gate is supplied with the level output signal; and
   a fourth transistor with the first terminal connected to the second terminal of the third transistor, the gate is supplied with the reference voltage, and the second terminal connected to the output node, and
   wherein the second control signal is applied to the output node through the second terminal of the fourth transistor.

7. The input buffer according to claim 6, wherein the fourth transistor is turned on when the reference voltage is lower than the predetermined voltage and is turned off when reference voltage is greater than or equal to the predetermined voltage.

8. The input buffer according to claim 1, wherein the predetermined voltage is half of a source voltage.

9. A semiconductor device comprising:
   an input buffer which receives an input signal and outputs a level detecting signal at a first level until a voltage level of a reference voltage signal reaches a predetermined voltage level;
   a latency control unit which activates or deactivates a data control signal, in response to the level detecting signal;
   an output selecting unit which transmits or blocks received data in response to the data control signal and generates an up-gate signal and a down-gate signal, in response to the level detecting signal; and
   an output driver which outputs the data through an output pin, in response to the up-gate signal and the down-gate signal;
   wherein the input buffer comprises:
      an output node;
      a first buffer which controls a voltage level of the output node when a voltage level of the reference voltage signal is equal to a predetermined voltage level and which does not control the voltage level of the output node when the voltage level of the reference voltage signal is less than the predetermined voltage; and
      a second buffer which controls the voltage level of the output node in response to an input signal when the voltage level of the reference voltage signal is lower than the predetermined voltage level and which does not control the voltage level of the output node when the voltage level of the reference voltage signal is equal to or greater than the predetermined voltage, and
   wherein the voltage level of the output node is opposite to the voltage level of the level detecting signal; and
   wherein the second buffer maintains the output node at a first level.

10. A semiconductor device comprising:
    an input buffer which receives an input signal and outputs a level detecting signal at a first level until a voltage level of a reference voltage signal reaches a predetermined voltage level;
    a latency control unit which activates or deactivates a data control signal, in response to the level detecting signal;
    an output selecting unit which transmits or blocks received data in response to the data control signal and generates an up-gate signal and a down-gate signal, in response to the level detecting signal; and
    an output driver which outputs the data through an output pin, in response to the up-gate signal and the down-gate signal;
    wherein the input buffer comprises:
       an output node;
       a first buffer which controls a voltage level of the output node when a voltage level of the reference voltage signal is equal to a predetermined voltage level and which does not control the voltage level of the output node when the voltage level of the reference voltage signal is less than the predetermined voltage; and
       a second buffer which controls the voltage level of the output node in response to an input signal when the voltage level of the reference voltage signal is lower than the predetermined voltage level and which does not control the voltage level of the output node when the voltage level of the reference voltage signal is equal to or greater than the predetermined voltage, and
    wherein the voltage level of the output node is opposite to the voltage level of the level detecting signal; and
    wherein the first buffer is a differential amplifier that is connected between a source voltage and a ground voltage and controls the voltage level of the output node in accordance with a comparison of the input signal and the reference voltage signal.

11. A semiconductor device comprising:
    an input buffer which receives an input signal and outputs a level detecting signal at a first level until a voltage level of a reference voltage signal reaches a predetermined voltage level;
    a latency control unit which activates or deactivates a data control signal, in response to the level detecting signal;
    an output selecting unit which transmits or blocks received data in response to the data control signal and generates an up-gate signal and a down-gate signal, in response to the level detecting signal; and
    an output driver which outputs the data through an output pin, in response to the up-gate signal and the down-gate signal;
    wherein the input buffer comprises:
       an output node;
       a first buffer which controls a voltage level of the output node when a voltage level of the reference voltage signal is equal to a predetermined voltage level and which does not control the voltage level of the output node when the voltage level of the reference voltage signal is less than the predetermined voltage; and a second buffer which controls the voltage level of the output node in response to an input signal when the voltage level of the reference voltage signal is lower than the predetermined voltage level and which does not control the voltage level of the output node when the voltage level of the reference voltage signal is equal to or greater than the predetermined voltage, and wherein the voltage level of the output node is opposite to the voltage level of the level detecting signal; and wherein the second buffer comprises:

an output control section which receives the input signal and generates a level output signal at a second level; and a level control section which generates a control signal which controls the output node at a first level, in response to the level output signal, when the voltage level of the reference voltage signal is lower than the predetermined voltage level, and overrides the control signal, when the voltage level of the reference voltage signal is equal to the predetermined voltage level.

12. The semiconductor device according to claim 11, wherein the output control section comprises:

a first resistor with one end connected to a source voltage;

a first transistor with the first terminal connected to the other end of the first resistor, the gate supplied with the input signal, and the second terminal connected to a second node;

a second transistor with the first terminal connected to the second node and the gate supplied with the input signal;

a second resistor with one end connected to the second terminal of the second transistor and the other end connected to a ground voltage; and an inverter which inverts the voltage level of the second node and outputs the inverted voltage level as the level output signal.

13. The semiconductor device according to claim 12, wherein the resistances of the first resistor, the second resistor, the first transistor, and the second transistor of the output control section are adjusted, such that the level output signal is output at a second level.

14. The semiconductor device according to claim 11, wherein the level control section comprises:

a third transistor with the first terminal connected to a source voltage and the gate supplied with the level output signal; and a fourth transistor with the first terminal connected to the second terminal of the third transistor, the gate supplied with the reference voltage signal, and the second terminal connected to the output node, and wherein the control signal is applied to the output node through the second terminal of the fourth transistor.

15. The semiconductor device according to claim 14, wherein the fourth transistor is turned on when the voltage level of the reference voltage signal is lower than the predetermined voltage level and is turned off when the voltage level of the reference voltage signal is greater than the predetermined voltage level.

16. A semiconductor device comprising:

an input buffer which receives an input signal and outputs a level detecting signal at a first level until a voltage level of a reference voltage signal reaches a predetermined voltage level;

a latency control unit which activates or deactivates a data control signal which controls transmission and interception of data, in response to the level detecting signal;

an output selecting unit which transmits or blocks the data in response to the data control signal and generates an up-gate signal and a down-gate signal which drives an output pin to a high impedance, in response to the level detecting signal; and an output driver which outputs the data through the output pin, in response to the up-gate signal and the down-gate signal;

wherein the input buffer comprises:

an output node;

a first buffer which controls a voltage level of the output node when a voltage level of the reference voltage signal is equal to a predetermined voltage level and which does not control the voltage level of the output node when the voltage level of the reference voltage signal is less than the predetermined voltage; and a second buffer which controls the voltage level of the output node in response to an input signal when the voltage level of the reference voltage signal is lower than the predetermined voltage level and which does not control the voltage level of the output node when the voltage level of the reference voltage signal is equal to or greater than the predetermined voltage, and wherein the voltage level of the output node is opposite to the voltage level of the level detecting signal; and wherein the predetermined voltage level is half of a source voltage level.

17. An input buffer comprising:

an output node;

a first buffer which is turned off in response to a buffer control signal, when a voltage level of a reference voltage signal is lower than a predetermined voltage level and the first buffer controls a voltage level of the output node when the voltage level of the reference voltage signal is equal to the predetermined voltage level and does not control the voltage level of the output node when the voltage level of the reference voltage signal is less than the predetermined voltage;

a second buffer which controls the voltage level of the output node, in response to an input signal, when the voltage level of the reference voltage signal is lower than the predetermined voltage level, and which does not control the voltage level of the output node when the voltage level of the reference voltage signal is equal to or greater than the predetermined voltage; and a buffer control unit which outputs a buffer control signal which turns on or turns off the first buffer, in accordance with the voltage level of the reference voltage signal, wherein the second buffer comprises:

an output control section which receives the input signal and generates a level output signal at a second level; and a level control unit which generates a control signal which maintains the output node at a first level, in response to the level output signal, when the voltage level of the reference voltage signal is lower than the predetermined voltage level and the level control unit overrides the control signal when the voltage level of the reference voltage signal is equal to the predetermined voltage level.

18. The input buffer according to claim 17, wherein the second buffer maintains the voltage level of the output node at a first level.

19. The input buffer according to claim 17, wherein the first buffer comprises a differential amplifier that is connected between a source voltage and a ground voltage and controls the voltage level of the output node in accordance with a comparison result of the reference voltage signal and the input signal,
- wherein the first buffer is turned on when the buffer control signal has a first level and is turned off when the buffer control signal has a second level, and
- wherein the first buffer controls the voltage level of the output node at the first level when the voltage level of the reference voltage signal is equal to the predetermined voltage level.

20. The input buffer according to claim 17, wherein the output control section comprises:
- a first resistor with one end connected to a source voltage;
- a first transistor with the first terminal connected to the other end of the first resistor, the gate supplied with the input signal, and the second terminal connected to a second node;
- a second transistor with the first terminal connected to the second node and the gate supplied with the input signal;
- a second resistor with one end connected to the second terminal of the second transistor and the other end connected to a ground voltage; and
- an inverter which inverts the voltage level of the second node and outputs the inverted voltage level as the level output signal.

21. The input buffer according to claim 20, wherein the resistances of the first resistor, the second resistor, the first transistor, and the second transistor of the output control section are adjusted, such that the level output signal is output at a second level in response to the input signal.

22. The input buffer according to claim 17, wherein the level control unit comprises:
- a third transistor with the first terminal connected to the source voltage and the gate supplied with the level output signal; and
- a fourth transistor with the first terminal connected to the second terminal of the third transistor, the gate supplied with the reference voltage signal, and the second terminal connected to the output node, and
- wherein the control signal is supplied to the output node through the second terminal of the fourth transistor.

23. The input buffer according to claim 22, wherein the fourth transistor is turned on when the voltage level of the reference voltage signal is lower than the predetermined voltage level and is turned off when the voltage level of the reference voltage signal is greater than or equal to the predetermined voltage level.

24. The input buffer according to claim 17, wherein the predetermined voltage level is half of a source voltage level.

25. The input buffer according to claim 17, wherein the buffer control unit outputs the buffer control signal at a second level when the voltage level of the reference voltage signal is lower than the predetermined voltage level and outputs the buffer control signal at a first level when the voltage level of the reference voltage signal is equal to the predetermined voltage level.

26. The input buffer according to claim 25, wherein the buffer control unit comprises:
- an operation control section which receives the reference voltage signal, adjusts the sizes of inner resistors and transistors, generates an operation control signal at a second level when the voltage level of the reference voltage signal is lower than the predetermined voltage level, and generates the operation control signal at a first level, when the voltage level of the reference voltage signal is equal to the predetermined voltage level; and
- a logical product section which performs a logical product of a mode signal and the operation control signal and outputs the buffer control signal.

27. The input buffer according to claim 26, wherein the operation control section comprises:
- a third resistor with one end connected to a source voltage;
- a fifth transistor with the first terminal connected to the other end of the third resistor, the gate supplied with the reference voltage signal, and the second terminal connected to a third node;
- a sixth transistor with the first terminal connected to the third node and the gate supplied with the reference voltage signal;
- a fourth resistor with one end connected to the second terminal of the sixth transistor and the other end connected to a ground voltage; and
- an inverter which inverts the voltage level of the third node and outputs the inverted voltage level as the operation control signal.

28. The input buffer according to claim 27, wherein the sizes of the third resistor, the fourth resistor, the fifth transistor, and the sixth transistor of the operation control section are adjusted such that the operation control signal is output at a second level when the voltage level of the reference voltage signal is lower than the predetermined voltage level.

29. The input buffer according to claim 28, wherein a mode signal is a signal generated at a first level during operation of the input buffer.

30. The input buffer according to claim 17, wherein the buffer control unit comprises a logical product section which performs a logical product of a mode signal and the reference voltage signal and outputs the buffer control signal.

31. An input buffer comprising:
- an output node;
- a first buffer which receives an input signal and a reference voltage, compares the input signal and the reference voltage, and outputs a first control signal, where the first control signal controls a voltage level of an output node when the reference voltage is equal to or greater than a predetermined voltage and does not control the voltage level of the output node when the voltage level of the reference voltage signal is less than the predetermined voltage; and
- a second buffer which receives the input signal and controls the voltage level of the output node in response to the input signal when the reference voltage is lower than the predetermined voltage, and which does not control the voltage level of the output node when the voltage level of the reference voltage signal is equal to or greater than the predetermined voltage,
- wherein the second buffer is turned on or turned off in response to the input signal and the voltage level of the reference voltage.

32. The input buffer according to claim 31, further comprising a level control section which turns on or turns off the second buffer in response to the input signal and the voltage level of the reference voltage.

33. The input buffer according to claim 32, wherein the second buffer comprises the level control section.

34. An input buffer comprising:
- an output node;
- a first buffer which is turned off in response to a buffer control signal when a voltage level of a reference voltage signal is lower than a predetermined voltage level, and which is turned on in response to the buffer control signal when the voltage level of the reference voltage signal is equal to the predetermined voltage level to control a voltage level of the output node;

a second buffer which controls the voltage level of the output node, in response to an input signal, when the voltage level of the reference voltage signal is lower than the predetermined voltage level, and which does not control the voltage level of the output node when the voltage level of the reference voltage signal is equal to or greater than the predetermined voltage level; and a buffer control unit which outputs a buffer control signal which turns on or turns off the first buffer, in accordance with the voltage level of the reference voltage signal.

* * * * *